United States Patent
Nygren

(10) Patent No.: US 7,304,495 B2
(45) Date of Patent: Dec. 4, 2007

(54) PSEUDODYNAMIC OFF-CHIP DRIVER CALIBRATION

(75) Inventor: Aaron Nygren, München (DE)

(73) Assignee: Infineon Technologies AG, Neubiberg (DE)

( * ) Notice: Subject to any disclaimer, the term of this patent is extended or adjusted under 35 U.S.C. 154(b) by 66 days.

(21) Appl. No.: 10/975,384

(22) Filed: Oct. 29, 2004

(65) Prior Publication Data

US 2005/0093569 A1    May 5, 2005

(30) Foreign Application Priority Data

Oct. 31, 2003  (DE) ................................ 103 51 016

(51) Int. Cl.
*H03K 17/16* (2006.01)
(52) U.S. Cl. ............................. 326/30; 326/83; 326/87
(58) Field of Classification Search .................. 326/26, 326/27, 30, 82–87
See application file for complete search history.

(56) References Cited

U.S. PATENT DOCUMENTS

| | | | | |
|---|---|---|---|---|
| 5,254,883 A | * | 10/1993 | Horowitz et al. | 326/30 |
| 6,127,862 A | * | 10/2000 | Kawasumi | 327/112 |
| 6,133,749 A | * | 10/2000 | Hansen et al. | 326/30 |
| 6,307,791 B1 | * | 10/2001 | Otsuka et al. | 365/189.05 |
| 6,429,679 B1 | * | 8/2002 | Kim et al. | 326/30 |
| 6,573,746 B2 | * | 6/2003 | Kim et al. | 326/30 |
| 6,636,821 B2 | | 10/2003 | Lawson | |
| 2003/0025535 A1 | | 2/2003 | Raychaudhuri | |

* cited by examiner

*Primary Examiner*—Don Le
(74) *Attorney, Agent, or Firm*—Edell, Shapiro & Finnan, LLC

(57) ABSTRACT

A driver system, a driver calibration circuit arrangement for calibration of an impedance of a driver circuit arrangement, and a method for calibration of an impedance of a driver circuit arrangement can achieve improved driver behavior, with respect to undesirable distortions of the slew rate caused by off-chip drivers of DDR memory modules. A driver system has a first driver part with at least one variable impedance by which an operating point of the first driver part is determined with respect to a first potential and a second potential. The potentials supply the first driver part. A first monitoring device adjusts an impedance value of the variable impedance such that the operating point differs from a mid-point of the first and of the second potential.

19 Claims, 3 Drawing Sheets

PSEUDODYNAMIC OFF-CHIP DRIVER CALIBRATION

CROSS REFERENCE TO RELATED APPLICATIONS

This application claims priority under 35 USC § 119 to German Application No. DE 10351016.8, filed on Oct. 31, 2003, and titled "Pseudodynamic Off-Chip Driver Calibration," the entire contents of which are hereby incorporated by reference.

FIELD OF THE INVENTION

The present invention relates to a driver system, a driver calibration circuit arrangement for calibration of an impedance of a driver circuit arrangement, and a method for calibration of an impedance of a driver circuit arrangement.

BACKGROUND

Off-chip drivers are known for carrying out various tasks. For example, off-chip drivers are used where a signal which has been produced within a chip, i.e., within an integrated semiconductor circuit (also referred to as a module) is intended to be amplified before being transmitted to a circuit, which is external to the chip. The signal power or the signal level of the signal, which is produced on the chip, can be matched to the requirements of the external circuit without the entire integrated semiconductor circuit supplying the signal power or signal level.

An off-chip driver can be used to terminate lines, which lead from an external circuit to the chip, i.e., the external lines present a terminating impedance, whose impedance value ensures that the signal profile via the lines is as clean as possible.

Since an off-chip driver forms an interface between an integrated semiconductor circuit and an external circuit, it is normally formed on the chip, i.e., as part of the integrated semiconductor circuit. Its designation as an off-chip driver indicates the fact that an off-chip driver is normally used to drive a signal intended for the exterior (outside the chip).

FIG. 1 shows a schematic illustration of a conventional application configuration of an off-chip driver. The illustration shows an integrated semiconductor circuit 100, which, for example, includes a logic circuit 10, a driver circuit arrangement 20, which acts as the off-chip driver, and a driver calibration circuit arrangement 40. Such an integrated semiconductor circuit 100 is normally encapsulated in an airtight package.

Connecting pins 101, which project from the package, are used to provide an electrical connection for circuits that are located outside the package. The illustrated integrated semiconductor circuit 100 has 11 connecting pins 101, for example. These are power-supplying connecting pins $V_{dd}$ and ground, the signal-carrying connecting pins $S_1$-$S_8$ as well as the connecting pin ZQ, which connects to a reference impedance $Z_{ref}$. Such a reference impedance may also, of course, be provided within the package, for example, as part of the integrated semiconductor circuit 100.

This is worthwhile, for example, when the impedance to be represented by the reference impedance is already known at the time when the integrated semiconductor circuit 100 is being designed.

Although this is not shown explicitly in the figure, it is obvious to those skilled in the art that each of the connecting pins is connected to at least one corresponding line on the integrated semiconductor circuit 100. For example, the illustration shows that both the logic circuit 10 and the driver circuit arrangement 20 as well as the driver calibration circuit arrangement 30 are connected to $V_{dd}$ and to ground.

In the illustrated integrated semiconductor circuit 100, the logic circuit 10 represents the core of the semiconductor circuit 100, where data is, for example, processed, stored, or produced. The data flows to and from the logic circuit 10 via signal lines 11, which are connected to the driver circuit arrangement 20. The driver circuit arrangement 20 acts as an interface between the illustrated 8 signal lines 11 and the 8 signal lines 23, which are individually annotated $S_1$-$S_8$, and lead to corresponding connecting pins 101 on the semiconductor circuit 100. The signal lines $S_1$-$S_8$ are connected via the connecting pins 101 to corresponding signal lines 41 from an external circuit 40 which, for example, represents a circuit that uses the logic circuit 10. For example, the integrated semiconductor circuit 100 together with the logic circuit 10 could be a memory chip, and the external circuit 40 could be a computer motherboard.

The operating behavior of the driver circuit arrangement 20 can be influenced via the driver calibration circuit arrangement 30, which is connected via, for example, 5 signal lines 24 to the driver circuit arrangement 20. The method of operation of a driver calibration circuit arrangement and its influence on an off-chip driver will be described in a general form in the following text, i.e., without reference to the figures.

High-quality off-chip drivers can operate with a specific and stable driver impedance. This is frequently achieved by digital compensation algorithms, which digitally vary the power of the off-chip driver in order to match the driver power to an intended value.

Since integrated semiconductor circuits are normally designed, manufactured, and marketed as individual components without any knowledge of the signal and/or impedance requirements of any external circuit, mechanisms which allow the off-chip driver to be matched to the signal and/or impedance requirements of an external circuit once the chip and the external circuit have been connected to one another are desirable.

Such matching of an off-chip driver is normally carried out based on three parameters, i.e., based on a first supply potential, a second supply potential and a reference impedance, which can be applied to or connected to specific connecting pins of the chip in a specific configuration. The impedance of the off-chip driver is varied as appropriate based on these parameters.

According to the prior art, the off-chip driver can be matched by a (digital) search algorithm. A variable impedance of the off-chip driver forms a voltage divider between the two supply voltages via a series circuit with the reference impedance and compares an output voltage from the voltage divider with an internally produced reference voltage, which is equal to the mid-value between the two supply potentials. The variable impedance of the off-chip driver is varied in accordance with the search algorithm until the output voltage from the voltage divider and the reference voltage are identical, with sufficient accuracy. If the voltage divider includes a series circuit formed by the variable impedance of the off-chip driver and the reference impedance, the variable impedance at the end of the search algorithm is equal to the reference impedance, with a specific accuracy.

Such matching of the off-chip driver has been found to be disadvantageous in many applications, inter alia as an interface between DDR memory modules (DDR="double-data-rate") and corresponding external circuits. In particular, an off-chip driver that has been matched in this way exhibits undesirable distortion of the slew rate and thus of the operating cycle in a circuit combination such as this.

A driver system, a driver calibration circuit arrangement for calibration of an impedance of a driver circuit arrangement, and a method for calibration of an impedance of a driver circuit arrangement, which can improve driver behavior, is desirable.

SUMMARY OF THE INVENTION

The instant invention is applicable, in particular, in conjunction with a driver system or a driver circuit arrangement for a memory system, in particular, for a GDDR3 memory chip, in particular where the driver system or the driver circuit arrangement forms an interface, i.e., an off-chip driver, between an integrated semiconductor circuit and an external circuit.

If the mid-point of an operating range of a driver circuit arrangement differs from the mid-point of a supply voltage for the driver circuit arrangement, then a potential, which is in the operating range, for instance, at the mid-point of the operating range, is used as the reference potential for calibration of the driver circuit arrangement. In this situation, the reference potential may correspond to the mid-point of the supply voltage of the driver circuit arrangement.

If the mid-point of an operating range of a driver circuit arrangement corresponds to the mid-point of a supply voltage of the driver circuit arrangement, then a potential, which differs from the mid-point of the supply voltage, is used as the reference potential for calibration of the driver circuit arrangement. The reference potential is, for example, in the operating range.

The reference potential for a calibration process and/or for a calibration arrangement can differ from the mid-point of the supply voltage for a driver circuit arrangement to be calibrated. The potential may not differ from the mid-point between the two supply voltages and may be used as the reference voltage.

In particular, a potential can differ from the mid-point between the two supply voltages by using as the reference voltage.

Likewise, a variable impedance of a calibration circuit can be calibrated with respect to a reference impedance such that their impedances differ from one another in a predetermined ratio.

The impedance of a driver circuit arrangement whose impedance is variable is varied sequentially until the potential at a junction point between a reference impedance and the driver circuit arrangement whose impedance is variable is equal to a mid-point of a predetermined operating range within ±10%, for instance, within ±3%, of a difference between a first and a second supply potential, with the mid-point of the predetermined operating range differing from the mid-point between the first and the second supply potential.

The impedance value of a variable impedance of a driver part is set such that a driver part operating point, which is determined by the variable impedance with respect to a first and a second supply potential, differs from a mid-point of the first and of the second potential.

Applications exist which place unequal requirements on a pull-up branch and a pull-down branch of an off-chip driver, i.e., in an asymmetrical behavior, for example, between a pull-up branch and a pull-down branch in a driver circuit arrangement.

Various embodiments propose that an operating point of the driver circuit arrangement should differ from the mid-point of the supply potentials. Drivers, in particular, off-chip drivers, tend to have a non-linear behavior, in which the driver impedance is likewise different in different operating ranges (i.e., for different drain/source voltages of a transistor acting as a driver element). As a consequence, a driver, which has been calibrated at one operating point, which is not the same as the operating point at which the driver is operated, does not have the impedance intended as a result of the calibration.

Various embodiments propose that a variable impedance of a driver calibration circuit arrangement be varied such that its impedance value is equal to a predetermined percentage of the impedance value of a reference impedance, which differs from 100%.

A driver part or a driver circuit arrangement is a circuit arrangement which has at least one amplifying element. A driver part or a driver circuit arrangement may thus, for example, be a pull-up or a pull-down branch of an inverter.

A driver part according to the invention or a driver circuit arrangement according to the invention is, for instance, formed integrally with an integrated semiconductor circuit, for example, in the form of a DDR memory module, in particular, a GDDR3-memory chip, as an off-chip driver.

A driver part may be supplied and a driver circuit arrangement fed with a first and a second potential, directly and indirectly, via other circuit arrangements. If, for example, a driver part is a pull-up branch in a driver circuit arrangement, then the supply or the feed could be provided via a pull-down branch in the driver circuit arrangement. For example, the pull-up branch and the pull-down branch could form a series circuit, which is connected between the first and the second potential. Those skilled in the art will, of course, also be familiar with innumerable alternative configurations to ensure a direct or indirect supply to a driver part, or feed to a driver circuit arrangement.

The expression "variable impedance" covers any element whose impedance can be varied in a controlled manner. A large number of such elements will be familiar to those skilled in the art. For example, one embodiment of a variable impedance is represented by two or more driver elements connected in parallel, in which each driver element includes a transistor and a non-reactive resistance connected in series. The impedance of the parallel circuit can be influenced in a controlled manner by switching respective transistors on and off.

The monitoring device according to the invention may, for example, be in the form of a programmable or hard-wired logic circuit. Any monitoring steps carried out by the monitoring device are, for instance, carried out automatically and quickly after any required initialization process, which could be initiated internally or externally.

The monitoring device, for instance, varies the impedance value of a variable impedance sequentially in a manner which corresponds to a search algorithm. A known search algorithm, which relatively shortens the search time in comparison to linear search methods, may be used without here with an appropriate choice of the nominal voltage.

If the variable impedance, which is varied by the monitoring device during the search algorithm, is a reference impedance whose impedance value has no direct influence on the behavior of a driver circuit arrangement, then the monitoring device can adjust the impedance of a driver circuit arrangement or of a driver part in a corresponding manner to the configuration of the reference impedance that has the desired impedance value. If the variable impedance, which is varied by the monitoring device during the search algorithm, is the impedance of a driver circuit arrangement, then further adjustment of the impedance after completion of the search algorithm is not necessary. In this case, the search algorithm represents the calibration process.

According to the invention, the operating point of a driver part or of a driver circuit arrangement is, for instance, located at the mid-point of its operating range. The operating range can be defined by the desired voltage range in the output signal from the driver part or from the driver circuit arrangement and the reference potential. If the signal shift of the output signal from a driver circuit arrangement is, for example, 0.6 times the supply voltage ($V_{supply}$) and the level of the output signal is related to ground (0 V), then this results in an operating range from 0 V to $0.6*V_{supply}$. The operating point would accordingly be $0.3*V_{supply}$.

The operating point, which is set with an external load, corresponds to the potential, which occurs at a junction point between the reference impedance, that simulates the external load and a circuit arrangement, which simulates the driver impedance and has a variable impedance. The circuit arrangement according to the invention has a variable impedance can simulate the behavior of the driver impedance. If the impedance value of the circuit arrangement is variable, and the impedance is varied such that the desired operating point is set, then the correct setting of the driver impedance can be deduced from the configuration of the circuit arrangement with a variable impedance, in order to obtain the operating point in the driver mode.

According to the invention, a driver system may have two or more driver parts, each with at least one variable impedance. Similarly, a driver circuit arrangement according to the invention may have two or more amplifying elements, each with a predetermined preferred operating point and at least one variable impedance. A driver calibration circuit arrangement may also have two or more circuit arrangements whose impedance is variable. The variation of the impedance value of the respective variable impedances to be carried out during or after the search algorithm can be carried out by one or more monitoring devices. A single circuit arrangement whose impedance is variable may be used for calibration of two or more or even only one associated driver circuit arrangement.

With individual calibration of the impedance value of each amplifying element, and improved linearization of the amplifying elements over their respective operating range, this calibration is referred to as pseudodynamic calibration.

It is known that calibration with respect to a reference voltage or an operating point which corresponds to the mid-value of the supply voltages has been found to be disadvantageous for many applications.

To the contrary the respective operating point can differ from the mid-value of the supply voltages by at least 15% of the difference between the supply voltages. If there are two amplifying elements which are respectively calibrated above and below the mid-value of the supply voltages, then their operating points differ by at least 30% from the difference between the supply voltages, which provides relative individuality in operating behavior.

For respective operating points to differ from the mid-value of the supply voltages by at most, for example, 35% of the difference between the supply voltages is a beneficial restriction on the individuality of the calibration and provides good operating behavior of the amplifying elements in an operating range which extends to the mid-value between the supply voltages.

In a binary operating configuration, such as an inverter with a pull-up and pull-down branch, an operating point can differ by 20% from the mid-value of the supply voltages.

To avoid stringent demands on the search algorithm, the operating point is, for instance, determined with an accuracy of only 10% of the difference between the supply voltages. Where complexity allows this, the operating point is, however, for instance, determined with an accuracy of 3% of the difference between the supply voltages, which corresponds approximately to the accuracy of a five-stage bisectional search algorithm.

Stated accuracy values and other numerical values are exemplary. Other accuracies and numerical values may also be chosen as required within the scope of the invention. When choosing an appropriate accuracy, the person skilled in the art will make a trade-off between the negative effects of excessively high accuracy, for example, on the search complexity, and the positive effects of high accuracy, for example, on the behavior of the driver circuit arrangement. In an analogous manner, the person skilled in the art will, for example, make a trade-off between the possible positive and negative circuitry effects of his choice when choosing an appropriate operating point.

When two operating points have to be determined for a driver system or a driver circuit arrangement, these are, for instance, placed by the same amount, but in opposite direction away from the mid-value of the supply voltages in order to achieve a symmetrical overall behavior for the driver system or the driver circuit arrangement.

In addition to calibration via a desired operating point, asymmetric driver behavior according to the invention can also be set in an analogous manner by varying a variable impedance of a driver calibration circuit arrangement such that its impedance value is equal to a predetermined percentage of the impedance value of a reference impedance, which percentage differs from 100%.

The feature combinations according to the invention are, for instance, used in or in conjunction with DDR memory modules, in particular with DDR2, DDR3, and GDDR3 memory modules.

BRIEF DESCRIPTION OF THE FIGURES

The invention and feature of the invention will be explained in more detail in the following text with reference to the drawing, which uses exemplary embodiments, without the intention of in any way restricting the respective fundamental idea of the invention in the process, since a person skilled in the art will be provided with numerous design variations on the basis of the teaching provided by the invention, without departing from the scope of the invention. In the figures.

DETAILED DESCRIPTION

Figure 1:
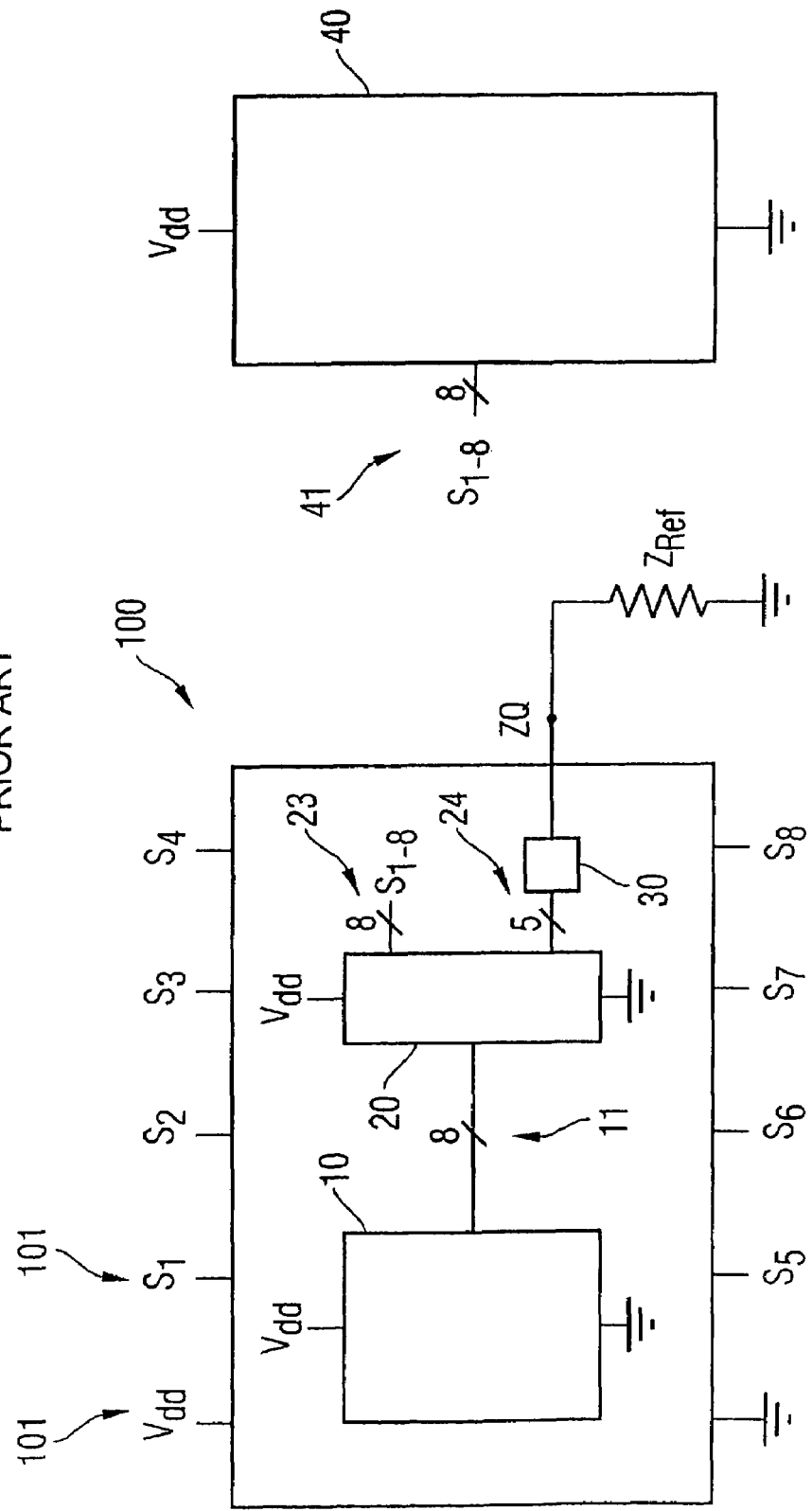
FIG. 1 shows a schematic illustration of a conventional application configuration of an off-chip driver.
Figure 2:
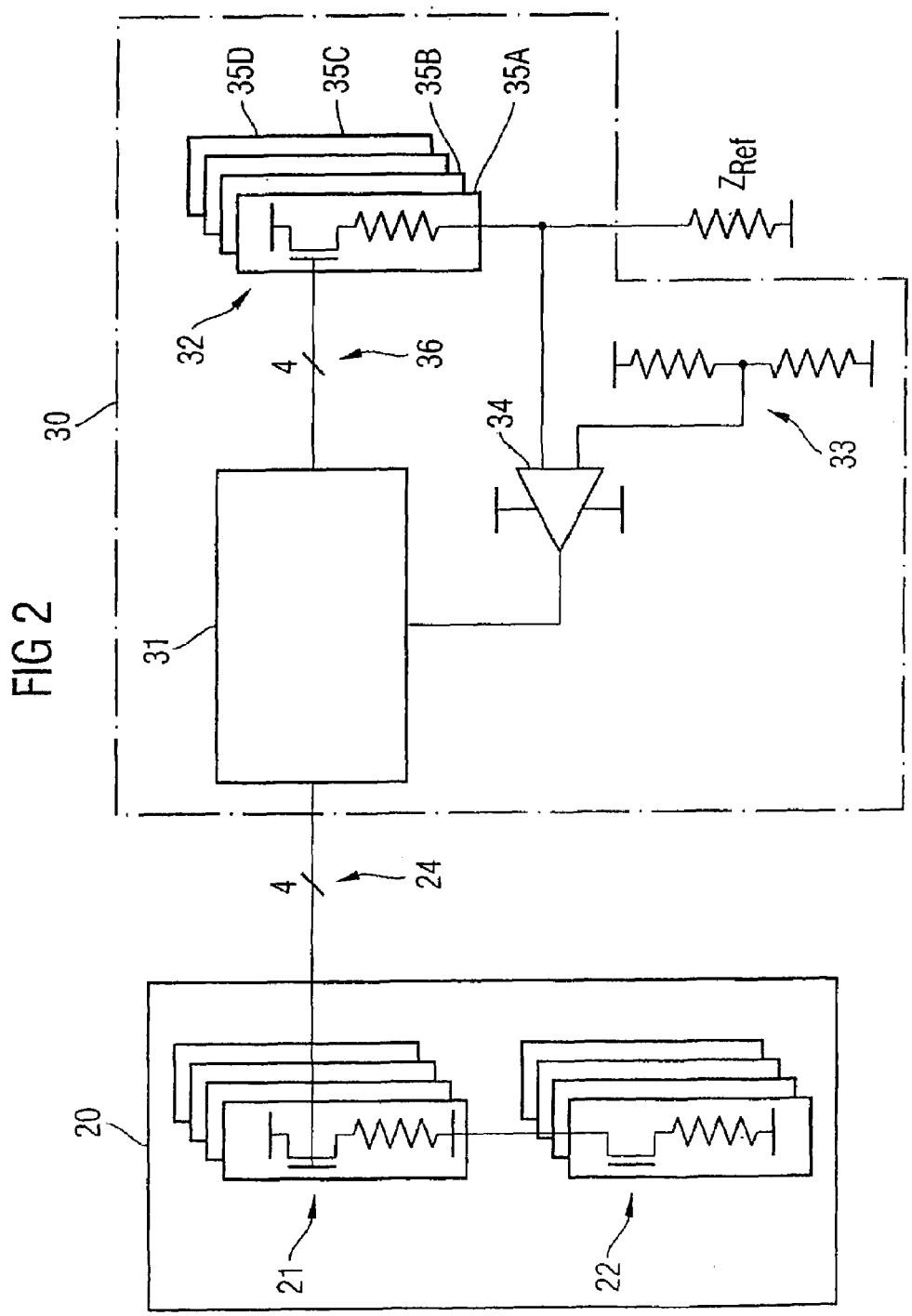
FIG. 2 shows a schematic illustration of a driver calibration circuit arrangement according to a first exemplary embodiment of the invention.

FIG. 2 shows a driver calibration circuit arrangement 30 according to a first exemplary embodiment of the invention, together with a driver circuit arrangement 20, illustrated schematically. The illustration shows a driver calibration circuit arrangement 30, which has a monitoring device 31, a variable impedance 32, a reference voltage divider 33, a comparator 34, and control lines 36. The driver calibration circuit arrangement 30 is connected to a reference impedance $Z_{Ref}$ and to the driver circuit arrangement 20. The latter connection is made via a control line 24 which, for example, has four conductors. The variable impedance 32 comprises two or more switchable impedances 35A-D, which can be switched on and off via the control lines 36. The driver circuit arrangement 20 has a pull-up branch 21 and a pull-down branch 22, whose respective impedance can be influenced via the control line 24.

Together with the reference impedance $Z_{Ref}$, the variable impedance 32 forms a voltage divider between two predetermined potentials. A point which is located between the variable impedance 32 and the reference impedance $Z_{Ref}$ is connected to one input of the comparator 34. The other input of the comparator 34 is connected to one output of the reference voltage divider 33, which is likewise connected between the two predetermined potentials. The output of the comparator 34 is fed back to the monitoring device 31.

During a calibration process for calibration of the driver circuit arrangement 20, the monitoring device 31 varies the impedance value of the variable impedance 32 in accordance with a predetermined search algorithm, with the switchable impedances 35A-D being addressed individually and switched on and off specifically via the signal lines 36. The progress through the search algorithm is determined dynamically as a function of the output signal from the comparator 34. The search algorithm ends when the two input signals applied to the comparator 34 are matched to one another as well as possible. The reference voltage divider 33 thus to a considerable extent determines the calibration result. If the reference voltage divider 33 is between the supply potentials of the driver circuit arrangement 20 and between the potentials which supply the series circuit formed by the variable impedance 32 and the reference impedance $Z_{Ref}$, then, according to the invention, the reference voltage divider 33 will have a division ratio other than 50:50.

In the illustrated situation, the variable impedance 32 simulates the impedance of the pull-up branch 21 of the driver circuit arrangement 20. In a corresponding way, the monitoring device 31 calibrates the impedance value of the pull-up branch 21 in the driver circuit arrangement 20 by signals via the control line 24 as a function of the impedance value of the variable impedance 32 at the end of the search algorithm. If the variable impedance 32 is relatively a 1:1 simulation of the impedance of the pull-up branch 21 of the driver circuit arrangement 20, there is, for example, a 1:1 relationship between the calibrated configuration of the variable impedance and the configuration, to be calibrated, of the pull-up branch 21 of the driver circuit arrangement 20. Other relationships are, of course, also possible within the scope of the invention.

The pull-down branch is calibrated in an analogous manner, using an appropriately different reference voltage divider.

Figure 3:
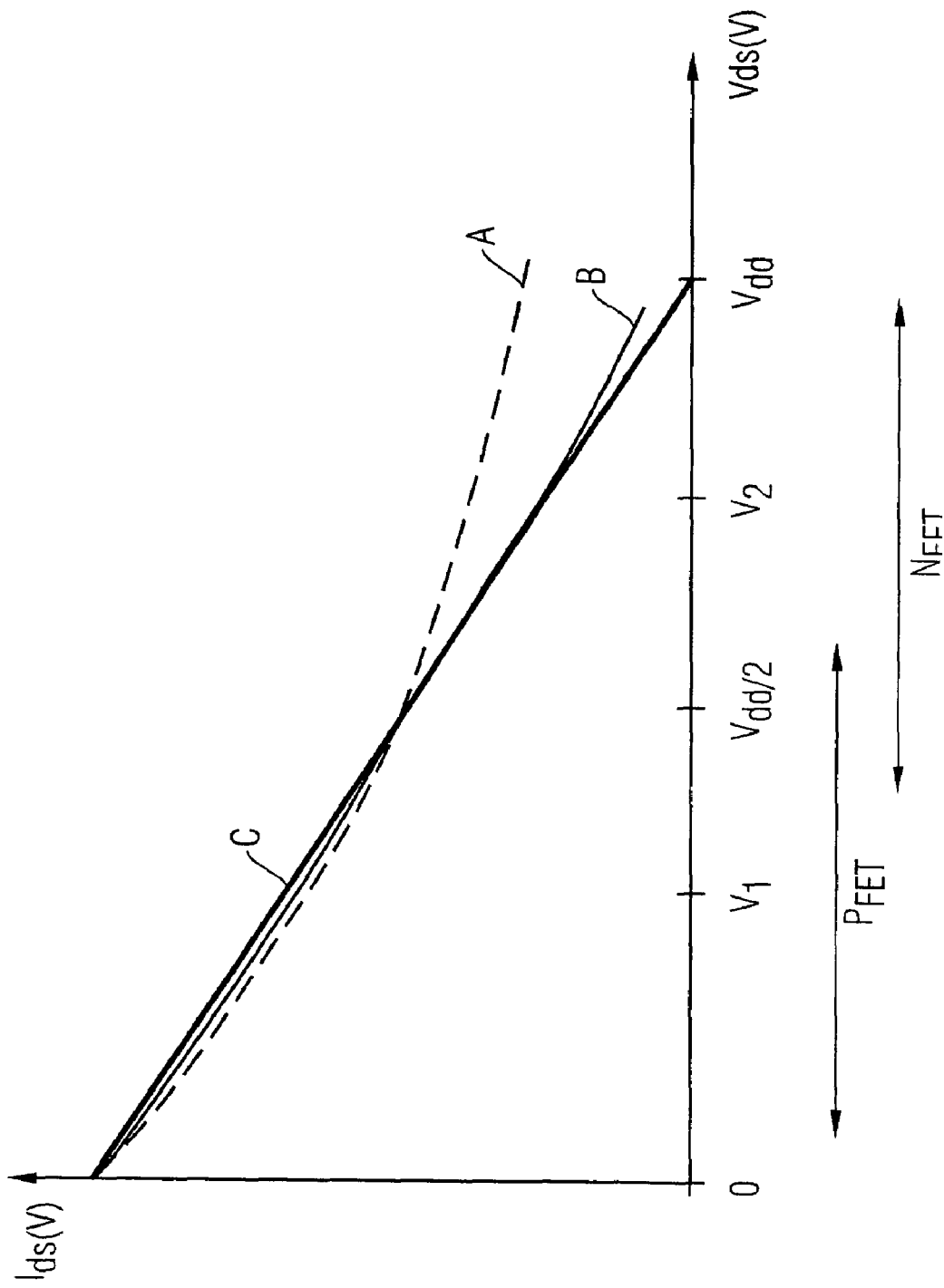
FIG. 3 shows a schematic illustration of various current/voltage characteristics for a driver circuit arrangement.

FIG. 3 shows a schematic illustration of various current/voltage characteristics of a driver circuit arrangement over its entire operating range, with the voltage ranges annotated by $P_{FET}$ and $N_{FET}$ denoting the operating range of a pull-up and pull-down branch of the driver circuit arrangement, respectively.

The line C shown in the bold form represents the IV characteristic of an ideal resistance. In contrast, the dashed line A represents the IV characteristic of a conventional driver circuit arrangement, whose pull-up and pull-down branches have been calibrated at $V_{dd}/2$. In the operating range of the pull-up branch of a driver circuit arrangement which has been calibrated in this way, the characteristic A does not differ significantly from the ideal behavior, owing to the linearity of the driver circuit arrangement in this operating range. In the operating range of the pull-down branch, the driver circuit arrangement which has been calibrated in this way differs considerably from the ideal behavior.

The thin line B represents the IV characteristic for a driver circuit arrangement according to the invention whose pull-up branch has been calibrated at the operating point $V_1$ and whose pull-down branch has been calibrated at the operating point $V_2$. This characteristic has a relatively ideal behavior over the entire operating range of the driver circuit arrangement. This illustrates one advantage of the invention.

In summary, the invention may have some or all of the following features.

A driver system can include a first driver part and a first monitoring system. The first driver part has at least one variable impedance by which an operating point is determined for the first driver part with respect to a first potential and a second potential which supply the first driver part. The first monitoring device adjusts an impedance value of the variable impedance such that the operating point differs from a mid-point between the first and the second potential.

The driver system may have a second driver part, which is supplied by the first and the second potential, and a second monitoring device. The second driver part can have at least one variable an impedance by which an operating point is determined for the second driver part with respect to a first potential and a second potential. The second monitoring device adjusts an impedance value of the variable impedance of the second driver part such that the operating point of the second driver part differs from a mid-point between the first and the second potential. Alternatively, the driver system may have a second driver part, which is supplied by the first and the second potential. The second driver part has at least one variable impedance by which an operating point is determined for the second driver part with respect to a first potential and a second potential. The first monitoring device adjusts an impedance value of the variable impedance of the second driver part such that the operating point of the second driver part differs from a mid-point between the first and the second potential.

The driver system may also have the operating point of the first and/or of the second driver part differ from the mid-point by more than 15% of the difference between the first and the second potential.

Alternately, the driver system may have the operating point of the first and/or of the second driver part differ from the mid-point by less than 35% of the difference between the first and the second potential.

The driver system may have the magnitude of the difference between the mid-point and the operating point of the first driver part may be the same, but in the opposite direction of the difference between the mid-point and the operating point of the second driver part.

The driver system may have the first and/or the second driver part form the pull-up and pull-down branch, respectively, of an off-chip driver.

The driver system may have the operating point of the first driver part as the mid-point in a predetermined operating range of a transistor of a first conductance type in the first driver part, and/or the operating point of the second driver part as the mid-point in a predetermined operating range of a transistor of a second conductance type in the second driver part.

The driver system may further include a first voltage divider and/or a second voltage divider. The first voltage divider has two series-connected impedances between the first and the second potential. The two impedances are chosen such that the potential at a junction point between the two impedances is the mid-point in a predetermined operating range of a transistor of a first conductance type in the first driver part. The second voltage divider has two series-connected impedances between the first and the second potential. The two impedances in the second voltage divider are chosen such that the potential at a junction point between the two impedances in the second voltage divider is the mid-point in a predetermined operating range of a transistor of a second conductance type in the second driver part.

A memory system, in particular, a GDDR3/DDR3 memory chip, can include a driver system as described above.

A driver calibration circuit arrangement for calibration of an impedance of a driver circuit arrangement, which is fed by a first and a second potential and has a predetermined operating range with respect to the first and the second potential, can include a circuit arrangement and a monitoring device. The circuit arrangement has a variable impedance and accommodates a reference impedance. The monitoring device is arranged and designed for sequential variation of the impedance of the circuit arrangement with a variable impedance, until the potential at a junction point between the reference impedance and the circuit arrangement with a variable impedance is equal to a mid-point in the predetermined operating range, within ±10%, for example, within ±3%, of the difference between the first and the second potential. The mid-point in the predetermined operating range differs from the mid-point between the first and the second potential.

The driver calibration circuit arrangement can have the mid-point of the predetermined operating range differ from the mid-point between the first and the second potential by more than 15% of the difference between the first and the second potential. Alternatively, the driver calibration circuit arrangement can have the mid-point of the predetermined operating range differ from the mid-point between the first and the second potential by less than 35% of the difference between the first and the second potential. In another alternative, the driver calibration circuit arrangement can have the mid-point of the predetermined operating range differing from the mid-point between the first and the second potential by 20% of the difference between the first and the second potential.

The driver calibration circuit arrangement may have the circuit arrangement with the variable impedance form an impedance for the driver circuit arrangement.

A memory system, in particular, a GDDR3/DDR3 memory chip, can have a driver calibration circuit arrangement as described above.

A method for calibration of an impedance of a driver circuit arrangement, which is fed by a first and a second potential and has a predetermined operating range with respect to the first and the second potential, can include sequentially varying the impedance of a circuit arrangement with a variable impedance. The circuit arrangement accommodates a reference impedance, until the potential at a junction point between the reference impedance and the circuit arrangement with the variable impedance equals a mid-point of the predetermined operating range within ±10%, for example, within ±3%, of the difference between the first and the second potential. The mid-point of the predetermined operating range differs from the mid-point between the first and the second potential.

In this method, the mid-point of the predetermined operating range differs from the mid-point between the first and the second potential by more than 15% of the difference between the first and the second potential. Alternately, in this method, the mid-point of the predetermined operating range differs from the mid-point between the first and the second potential by less than 35% of the difference between the first and the second potential. In another alternative, in this method, the mid-point of the predetermined operating range differs from the mid-point between the first and the second potential by 20% of the difference between the first and the second potential.

In this method, the circuit arrangement with the variable impedance forms an impedance for the driver circuit arrangement.

In this method, the driver circuit arrangement is part of a memory system, in particular, a GDDR3/DDR3 memory chip.

A driver calibration circuit arrangement for calibration of an impedance of a driver circuit arrangement can include a circuit arrangement with a variable impedance, and a monitoring device. The monitoring device sequentially varies the impedance of the circuit arrangement with the variable impedance, until its impedance is equal to a predetermined percentage of the impedance of a reference impedance within ±10%, for example, within ±3%, of the impedance of the reference impedance, with the percentage not being 100%.

The driver calibration circuit arrangement can have the predetermined percentage differ by more than 15% from 100%. Alternately, the driver calibration circuit arrangement can have the predetermined percentage differ by less than 35% from 100%.

In another alternative, the driver calibration circuit arrangement can have the predetermined percentage differing by 20% from 100%.

The driver calibration circuit arrangement can have the circuit arrangement with the variable impedance form an impedance of the driver circuit arrangement. The driver calibration circuit arrangement can connect an external reference impedance as the reference impedance.

A memory system, in particular, a GDDR3/DDR3 memory chip, can have a driver calibration circuit arrangement as described above.

A method for calibration of an impedance of a driver circuit arrangement can include sequentially varying the impedance of a circuit arrangement with a variable impedance, until its impedance is equal to a predetermined percentage of the impedance of a reference impedance within ±10%, for example, within ±3%, with the percentage not being 100%.

In this method, the predetermined percentage differs by more than 15% from 100%. Alternately, in this method, the predetermined percentage differs by less than 35% from 100%. In another alternative, in this method, the predetermined percentage differs by 20% from 100%.

In this method, the circuit arrangement with the variable impedance forms an impedance of the driver circuit arrangement.

In this method, the circuit arrangement with the variable impedance connects an external reference impedance as the reference impedance.

In this method, the driver circuit arrangement is part of a memory chip, in particular, a GDDR3/DDR3 memory chip.

In the driver calibration circuit arrangement or method for calibration of an impedance of a driver circuit arrangement, as described above, the circuit arrangement with a variable impedance is formed by a single integrated circuit arrangement.

In the driver system, the memory system, the driver calibration circuit arrangement, or the method for calibration of an impedance of a driver circuit arrangement, as described above, the driver system or the driver circuit arrangement is an off-chip driver.

A driver system can include a first driver part and a first monitoring device. The first driver part has at least one variable impedance by which an operating point is determined for the first driver part with respect to a first potential and a second potential, which supply the first driver part. The first driver part has a predetermined operating range with respect to the first and the second potential with a mid-point that differs from the mid-point of the first and of the second potentials. The first monitoring device adjusts an impedance value of the variable impedance such that the operating point corresponds to a predetermined point, for instance, the mid-point, of the predetermined operating range within ±10%, for example, within ±3%, of the difference between the first and the second potential.

A driver calibration circuit arrangement for calibration of an impedance of a driver circuit arrangement, which is fed by a first and a second potential, has a predetermined operating range with respect to the first and the second potential, and has a mid-point that differs from the mid-point of the first and of the second potentials, can include a circuit arrangement with a variable impedance and a monitoring device. The circuit arrangement accommodates a reference impedance. The monitoring device sequentially varies the impedance of the circuit arrangement with the variable impedance, until the potential at a junction point between the reference impedance and the circuit arrangement with the variable impedance equals a predetermined point, for instance, the mid-point, of the predetermined operating range within ±10%, for example, within ±3%, of the difference between the first and the second potential.

A method for calibration of an impedance of a driver circuit arrangement, which has a predetermined operating range with respect to a first and a second potential and a mid-point that differs from the mid-point of the first and of the second potentials, can include sequentially varying the impedance of a circuit arrangement with the variable impedance, until an operating point, which is governed by the impedance, of the driver circuit arrangement coincides with a predetermined point, for instance, with the mid-point, of the predetermined operating range within ±10%, for example, within ±3%, of the difference between the first and the second potential.

Although the embodiments of the invention have been disclosed and described in detail in this description, it is obvious to a person skilled in the art that various changes can be made with respect to the configuration, the method of operation and the form of the invention without departing from the inventive idea or the area of protection. In particular, it should be noted that the respective features of the invention, including those which are disclosed only in conjunction with other features of the invention, may be combined in any desired configuration, apart from those which the person skilled in the art identifies as being obviously pointless. Furthermore, the use of the singular or of the plural indicates only a preference, and should therefore not be regarded as being restrictive. Except where the opposite is explicitly mentioned, the plural may be replaced by the singular, and vice versa.

While the invention has been described in detail and with reference to specific embodiments thereof, it will be apparent to one skilled in the art that various changes and modifications can be made therein without departing from the spirit and scope thereof. Accordingly, it is intended that the present invention covers the modifications and variations of this invention provided they come within the scope of the appended claims and their equivalents.

LIST OF REFERENCES 10 logic circuit
11 signal lines
20 driver circuit arrangement
21 pull-up branch
22 pull-down branch
23 signal lines
24 control line
30 Driver calibration circuit arrangement
31 monitoring device
32 variable impedance
33 reference voltage divider
34 comparator
35 switchable impedance
36 control lines
40 external circuit arrangement
41 signal lines
100 integrated semiconductor circuit
101 connecting pin

I claim:

1. A driver calibration circuit arrangement for calibration of an impedance of a driver circuit arrangement connected between a first potential and a second potential, the driver circuit arrangement having a predetermined operating range over only a portion of a range between the first and second potentials, the driver calibration circuit arrangement comprising:
 a circuit arrangement with a variable impedance;
 a reference impedance connected to the circuit arrangement; and
 a monitoring device for sequentially varying the impedance of the circuit arrangement with the variable impedance until the potential at a junction point between the reference impedance and the circuit arrangement with the variable impedance equals a mid-point of the predetermined operating range, wherein the mid-point of the predetermined operating range differs from the mid-point between the first and the second potentials.

2. The driver calibration circuit arrangement as claimed in claim 1, wherein the mid-point of the predetermined operating range differs from the mid-point between the first and the second potential by more than 15% of the difference between the first and the second potential.

3. The driver calibration circuit arrangement as claimed in claim 1, wherein the mid-point of the predetermined operating range differs from the mid-point between the first and the second potential by less than 35% of the difference between the first and the second potential.

4. The driver calibration circuit arrangement as claimed in claim 1, wherein the mid-point of the predetermined operating range differs from the mid-point between the first and the second potential by 20% of the difference between the first and the second potential.

5. The driver calibration circuit arrangement as claimed in claim 1, wherein the driver circuit arrangement is a pull-up amplifier.

6. The driver calibration circuit arrangement as claimed in claim 1, wherein the driver circuit arrangement is a pull-down amplifier.

7. A system, comprising:
- a driver circuit arrangement connected between a first potential and a second potential, the driver circuit arrangement having a predetermined operating range over only a portion of a range between the first and second potentials;
- a driver calibration circuit arrangement;
- a circuit arrangement with a variable impedance;
- a reference impedance connected to the circuit arrangement; and
- a monitoring device for sequentially varying the impedance of the circuit arrangement with the variable impedance until the potential at a junction point between the reference impedance and the circuit arrangement with the variable impedance equals a mid-point of the predetermined operating range, wherein the mid-point of the predetermined operating range differs from the mid-point between the first and the second potentials.

8. The system as claimed in claim 5, wherein the system is a GDDR3 memory chip.

9. A method for calibration of an impedance of a driver circuit arrangement connected between a first potential and a second potential, the driver circuit arrangement having a predetermined operating range over only a portion of a range between the first and second potentials, the method comprising:
- providing a calibration circuit comprising a circuit arrangement with a variable impedance coupled to a reference impedance; and
- sequentially varying of the impedance of the circuit arrangement with a variable impedance until the potential at a junction point between the reference impedance and the circuit arrangement with the variable impedance equals a mid-point of the predetermined operating range, wherein the mid-point of the predetermined operating range differs from the mid-point between the first and the second potentials.

10. The method as claimed in claim 9, wherein the mid-point of the predetermined operating range differs from the mid-point between the first and the second potential by more than 15% of the difference between the first and the second potential.

11. The method as claimed in claim 9, wherein the mid-point of the predetermined operating range differs from the mid-point between the first and the second potential by less than 35% of the difference between the first and the second potential.

12. The method as claimed in claim 9, wherein the mid-point of the predetermined operating range differs from the mid-point between the first and the second potential by 20% of the difference between the first and the second potential.

13. The method as claimed in claim 9, wherein the driver circuit arrangement is part of a memory system.

14. A driver calibration circuit for calibrating an impedance of a driver circuit connected between a first potential and a second potential, the driver calibration circuit comprising:
- a variable impedance circuit coupled to a reference impedance at a node; and
- a monitoring device configured to vary an impedance of the variable impedance circuit until a potential at the node substantially equals a calibration potential for the driver circuit, the calibration potential being different from a mid-point between the first and second potentials, wherein the monitoring device is further configured to calibrate the impedance of the driver circuit in accordance with the impedance of the variable impedance circuit corresponding to the calibration potential.

15. A system, comprising:
the driver calibration circuit of claim 14; and
the driver circuit.

16. A driver calibration circuit for calibrating an impedance of a driver circuit comprising first and second branches connected in series between first and second supply potentials, the driver calibration circuit comprising:
- a first reference voltage divider comprising a variable impedance circuit coupled to a first reference impedance at a first node;
- a second reference voltage divider comprising a variable impedance circuit coupled to a second reference impedance at a second node; and
- a monitoring device configured to sequentially varying the impedance of the variable impedance circuit of the first reference voltage divider until the potential at the first node substantially equals a first calibration potential, and to sequentially varying the impedance of the variable impedance circuit of the second reference voltage divider until the potential at the second node substantially equals a second calibration potential, the first and second calibration potentials being different from the mid-point between the first and the second potentials,
- wherein the monitoring device is further configured to calibrate the impedance of the first branch of the driver circuit in accordance with an impedance which produced the first calibration potential at the first node, and to calibrate the impedance of the second branch of the driver circuit in accordance with an impedance which produced the second calibration potential at the second node.

17. The driver calibration circuit of claim 16, wherein the first branch is a pull-up branch and the second branch is a pull-down branch.

18. The driver calibration circuit of claim 16, wherein:
the first branch of the driver circuit operates over a first range which is a portion of a range between the first and second potentials and the second branch of the driver circuit operates over a second range which is a portion of the range between the first and second potentials; and
the first calibration potential is a midpoint of the first range and the second calibration potential is a midpoint of the second range.

19. A system, comprising:
the driver calibration circuit of claim 16; and
the driver circuit.

* * * * *

UNITED STATES PATENT AND TRADEMARK OFFICE
CERTIFICATE OF CORRECTION

PATENT NO. : 7,304,495 B2  Page 1 of 1
APPLICATION NO. : 10/975384
DATED : December 4, 2007
INVENTOR(S) : Aaron Nygren It is certified that error appears in the above-identified patent and that said Letters Patent is hereby corrected as shown below:

Col. 13, l. 26: "claim 5" should read --claim 7--

Signed and Sealed this

First Day of April, 2008

JON W. DUDAS
*Director of the United States Patent and Trademark Office*